(12) United States Patent
Kanzaki et al.

(10) Patent No.: US 11,968,866 B2
(45) Date of Patent: Apr. 23, 2024

(54) DISPLAY DEVICE

(71) Applicant: Sharp Kabushiki Kaisha, Sakai (JP)

(72) Inventors: Yohsuke Kanzaki, Sakai (JP); Yi Sun, Sakai (JP); Takao Saitoh, Sakai (JP); Masahiko Miwa, Sakai (JP); Masaki Yamanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 374 days.

(21) Appl. No.: 17/620,276

(22) PCT Filed: Jun. 20, 2019

(86) PCT No.: PCT/JP2019/024571
§ 371 (c)(1),
(2) Date: Dec. 17, 2021

(87) PCT Pub. No.: WO2020/255350
PCT Pub. Date: Dec. 24, 2020

(65) Prior Publication Data
US 2022/0367592 A1 Nov. 17, 2022

(51) Int. Cl.
*H10K 59/131* (2023.01)
*G09F 9/30* (2006.01)
*G09F 9/302* (2006.01)
*G09F 9/33* (2006.01)
*H10K 59/121* (2023.01)
*H10K 59/124* (2023.01)
*H10K 102/00* (2023.01)

(52) U.S. Cl.
CPC ........... *H10K 59/131* (2023.02); *G09F 9/301* (2013.01); *G09F 9/3023* (2013.01); *G09F 9/335* (2021.05); *H10K 59/1213* (2023.02); *H10K 59/124* (2023.02); *H10K 2102/311* (2023.02)

(58) Field of Classification Search
CPC ............. H10K 59/131; H10K 59/1213; H10K 59/124; H10K 2102/311; H10K 71/621; G09F 9/301; G09F 9/3023; G09F 9/335; G09F 9/30
See application file for complete search history.

(56) References Cited

U.S. PATENT DOCUMENTS

| | | | |
|---|---|---|---|
| 2017/0262109 A1 | 9/2017 | Choi et al. | |
| 2019/0058140 A1* | 2/2019 | Shi | H10K 59/1213 |
| 2021/0005702 A1* | 1/2021 | Saitoh | H05B 33/22 |
| 2021/0313412 A1* | 10/2021 | Okabe | H10K 59/1315 |

* cited by examiner

*Primary Examiner* — Yasser A Abdelaziez
(74) *Attorney, Agent, or Firm* — Keating & Bennett, LLP

(57) ABSTRACT

A second connection wire is electrically connected to a first connection wire via a display-side contact portion and terminal-side contact portion in a bending section. The first connection wire and the second connection wire do not overlap each other at least partly between the display-side contact portion and terminal-side contact portion.

11 Claims, 11 Drawing Sheets

DISPLAY DEVICE

TECHNICAL FIELD

The disclosure relates to a display device.

BACKGROUND ART

A known display device (see Patent Literature 1) includes a flexible resin substrate, a thin-film transistor layer disposed on the resin substrate, and a light emitter disposed on the thin-film transistor layer. The resin substrate has a display region and a frame region disposed around the display region. The frame region has an end provided with a terminal section. The frame region also has a bending section extending in one direction between the terminal section and display region.

In the display device, the display region includes a plurality of display wires, and the bending section includes a plurality of connection wires electrically connecting the terminal section and display wires together.

This display device needs to be bent along the bending section, located between the terminal section and display region on the resin substrate, in order to reduce the size of the frame region on the flexible resin substrate.

CITATION LIST

Patent Literature

Patent Literature 1: United States Patent Application Publication No. 2017/0262109 (published on Sep. 14, 2017)

SUMMARY

Technical Problem

Unfortunately in the foregoing configuration, the connection wires at the bending section can have cracking resulting from a bending stress, thus possibly breaking the wires and increasing the resistance of the wires.

It is an object of one aspect of the disclosure to provide a display device that can avoid cracking in connection wires at a bending section.

Solution to Problem

A display device according to the disclosure includes the following: a resin substrate; a thin-film transistor layer disposed on the resin substrate; a light emitter disposed on the thin-film transistor layer; a display region; and a frame region disposed around the display region. The frame region includes a terminal section disposed at an end of the frame region, and a bending section extending in one direction between the terminal section and the display region. The thin-film transistor layer has a stack of, in sequence, a semiconductor layer, a gate insulating film, a first metal film, a first interlayer insulating film, a second metal film, a second interlayer insulating film, a third metal film, a first flattening film, a fourth metal film, and a second flattening film. The light emitter includes the following: a plurality of first electrodes arranged on the second flattening film; an edge cover covering the perimeters of the plurality of first electrodes; a luminous layer; and a second electrode. The bending section has a slit extending through the gate insulating film, the first interlayer insulating film and the second interlayer insulating film along the bending section. The slit is filled with a filling layer. The display region includes the following: a plurality of first display wires composed of the third metal film; the first flattening film covering the plurality of individual first display wires; a plurality of second display wires arranged on the first flattening film and composed of the fourth metal film; and the second flattening film covering the plurality of individual second display wires. The bending section includes a plurality of first connection wires arranged on the upper surface of the filling layer in a direction intersecting with a direction where the bending section extends. The plurality of first connection wires electrically connecting terminals at the terminal section to the plurality of first display wires. The plurality of first connection wires are composed of the third metal film. The bending section also includes a first resin film covering the plurality of first connection wires. The first resin film is made of a material identical to the material of the first flattening film. The first resin film is disposed in a layer identical to a layer where the first flattening film is disposed. The bending section also includes a plurality of second connection wires arranged on the upper surface of the first resin film in the direction intersecting with the direction where the bending section extends. The plurality of second connection wires are composed of the fourth metal film. Each of the plurality of second connection wires is electrically connected to a corresponding one of the plurality of first connection wires via a display-side contact portion adjacent to the display region in the bending section and via a terminal-side contact portion adjacent to the terminal section in the bending section. The first and second connection wires do not overlap each other at least partly between the display-side and terminal-side contact portions.

Advantageous Effect of Disclosure

The aspect of the disclosure can avoid cracking in the connection wires at the bending section.

DESCRIPTION OF EMBODIMENTS

A term "in the same layer" hereinafter refers to that one layer is formed in the same process step (film formation) as another layer. Further, a term "in a lower position than" hereinafter refers to that one layer is formed in a process step anterior to a process step of forming a comparative layer. Still further, a term "in a higher position than" hereinafter refers to that one layer is formed in a process step posterior to a process step of forming a comparative layer.

First Embodiment

Figure 1:
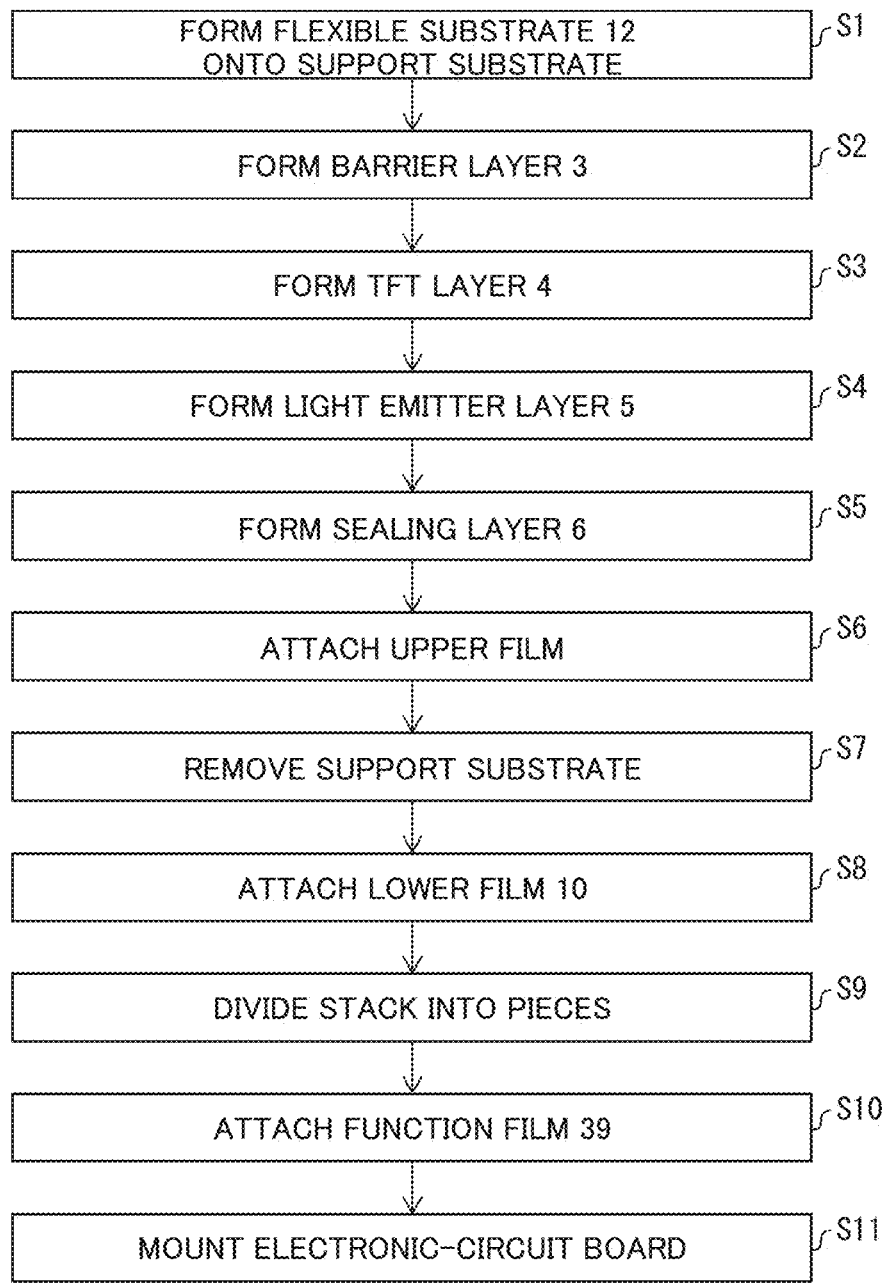
FIG. 1 is a flowchart illustrating an example method for manufacturing a display device.
Figure 2:
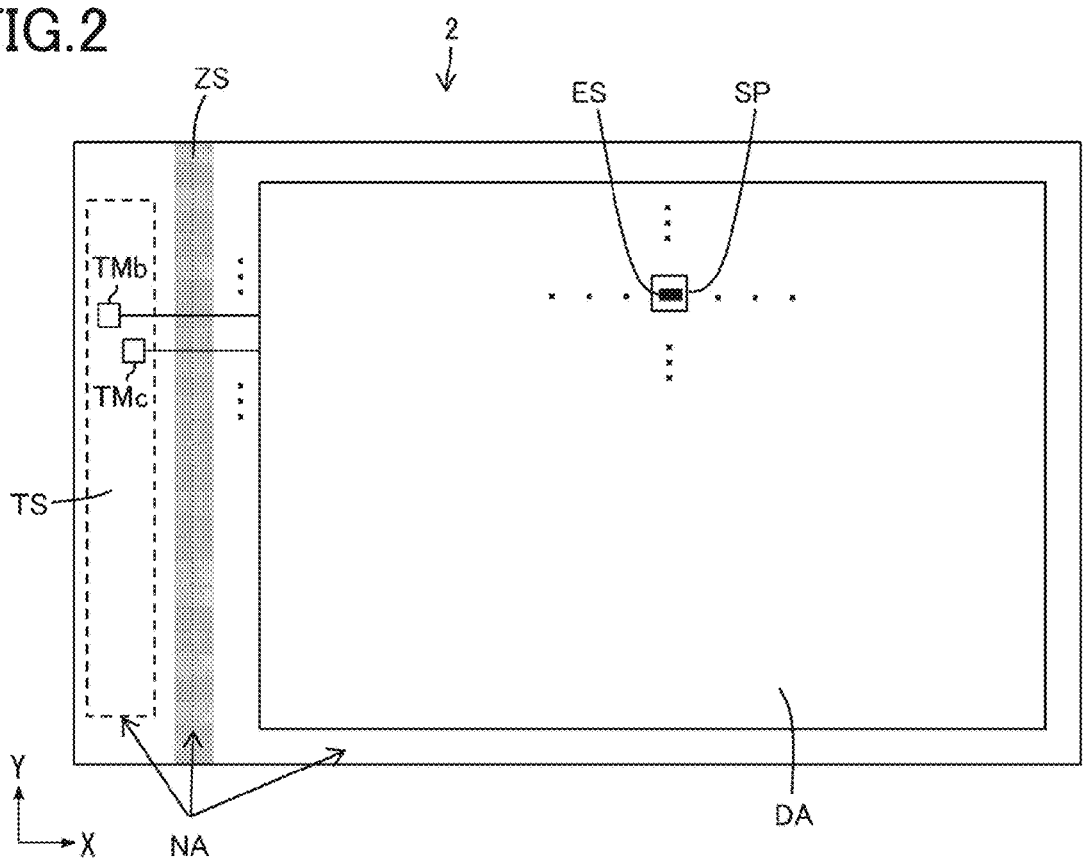
FIG. 2 is a schematic plan view of the display device.
Figure 3:
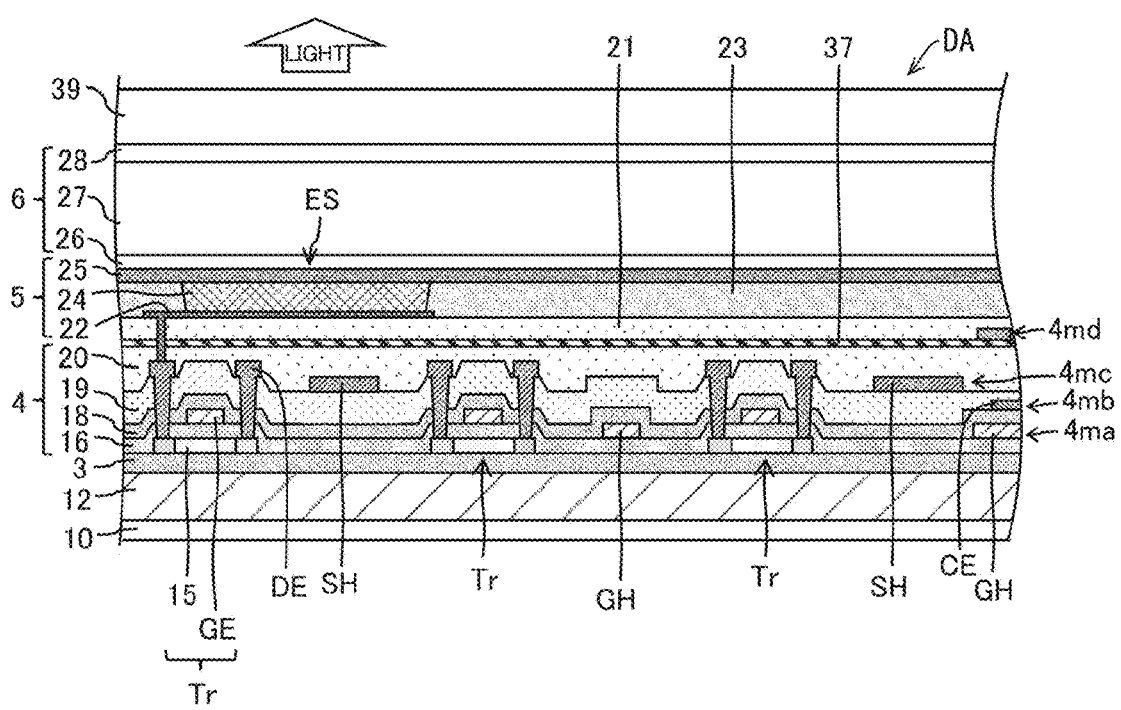
FIG. 3 is a schematic sectional view of a display region.

FIG. 1 is a flowchart illustrating an example method for manufacturing a display device 2. FIG. 2 is a schematic plan view of the display device 2. FIG. 3 is a schematic sectional view of a display region DA.

The display device 2, which is flexible, is manufactured through the following process steps, as illustrated in FIGS. 1 to 3. The first step is Step S1, which includes forming a flexible substrate 12 (resin substrate) onto a support substrate transparent to light (e.g., mother glass substrate). The flexible substrate 12 has the display region DA and a frame region NA disposed around the display region DA. The frame region NA includes a terminal section TS disposed at its end, and a bending section ZS extending in a Y-direction between the terminal section TS and display region DA.

The next is Step S2, which includes forming a barrier layer 3. The next is Step S3, which includes forming a TFT layer 4. The next is Step S4, which includes forming a light emitter layer 5 (light emitter), which is a top-emission light emitter layer. The light emitter layer 5 in the display region DA includes light emitters ES of sub-pixels SP. The next is Step S5, which includes forming a sealing layer 6. The next is Step S6, which includes attaching an upper film onto the sealing layer 6. The next is Step S7, which includes removing the support substrate from the flexible substrate 12 through, for instance, laser light irradiation. The next is Step S8, which includes attaching a lower film 10 onto the lower surface of the flexible substrate 12. The next is Step S9, which includes dividing a stack of the lower film 10, flexible substrate 12, barrier layer 3, TFT layer 4, light emitter layer 5 and sealing layer 6 into a plurality of pieces. The next is Step S10, which includes attaching a function film 39 to the divided pieces. The next is Step S11, which includes mounting electronic circuit boards (e.g., a driver chip and a flexible printed board) onto the terminal section TS (including terminals TMb and TMc) in the frame region NA. After Step S11, the display device 2 can be bent along the bending section ZS in the frame region NA.

Steps S1 to S11 are performed by a display-device manufacturing apparatus (including a film formation apparatus that performs Steps S1 to S5).

Figure 4:
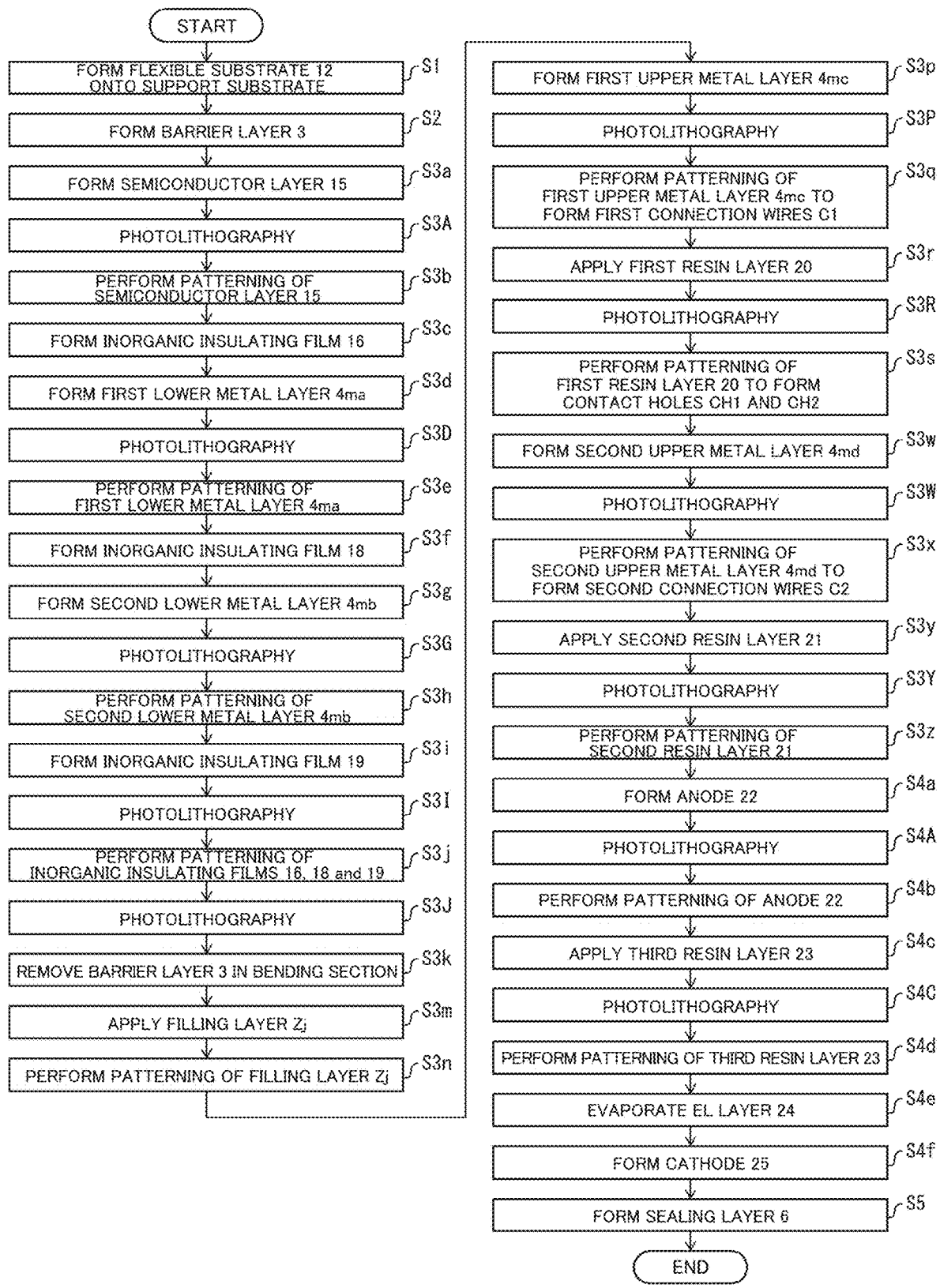
FIG. 4 is a flowchart illustrating in detail some process steps in the flowchart of FIG. 1.

FIG. 4 is a flowchart illustrating in detail Steps S3 and S4 in FIG. 1. As illustrated in FIG. 4, Step S2 is followed by Step S3a of forming a semiconductor layer 15, followed by Step S3A of photolithography, followed by Step S3b of patterning the semiconductor layer 15. The next is Step S3c of forming a bottom, inorganic insulating film 16 (gate insulating film), followed by Step S3d of forming a first lower metal layer 4ma (first metal film), followed by Step S3D of photolithography, followed by Step S3e of patterning the first lower metal layer 4ma. The next is Step S3f of forming a middle, inorganic insulating film 18 (first interlayer insulating film), followed by Step S3g of forming a second lower metal layer 4mb (second metal film), followed by Step S3G of photolithography, followed by Step S3h of patterning the second lower metal layer 4mb.

Figure 7:
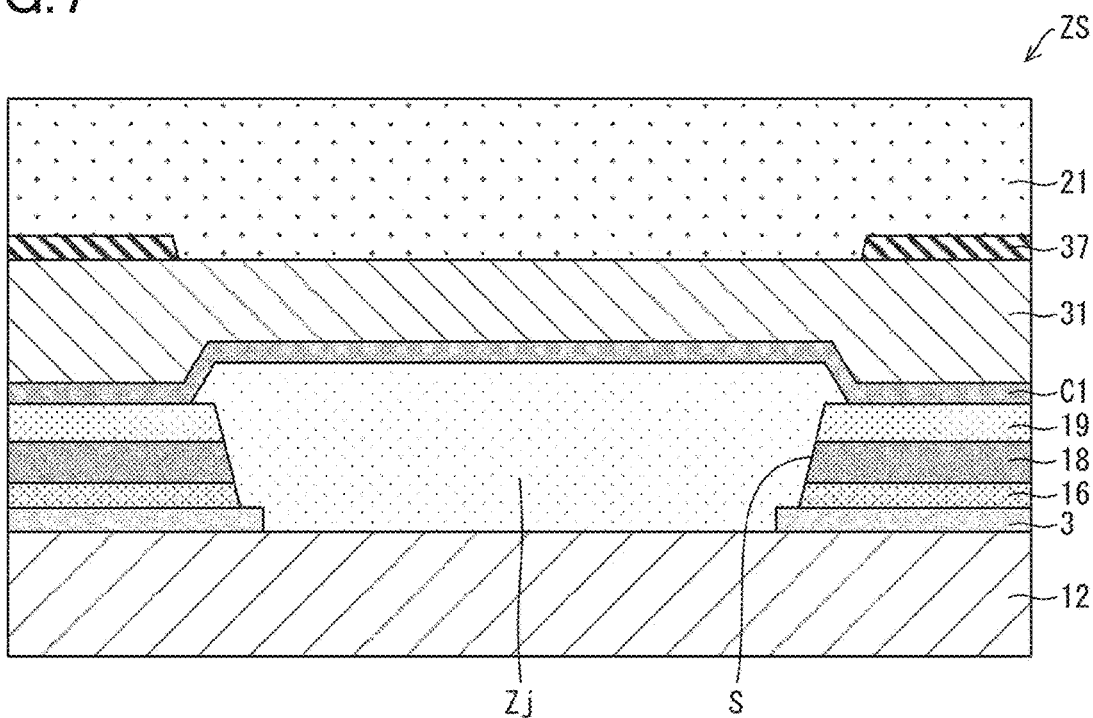
FIG. 7 is a sectional view taken along plane AA in FIG. 6.

The next is Step S3i of forming a top, inorganic insulating film 19 (second interlayer insulating film), followed by Step S3I of photolithography. Then in Step S3j, the inorganic insulating film 16, 18 and 19 undergo patterning to form contact holes for conduction electrodes DE. The next is Step S3J of photolithography, followed by Step S3k of removing the barrier layer 3 and inorganic insulating films 16, 18 and 19 in the bending section ZS to form a slit S (FIG. 7).

The next is Step S3m of applying a filling layer Zj. The next is Step S3n of removing the filling layer Zj within the pixels in the display region DA while leaving the filling layer Zj in only the slit S in the bending section ZS as it is, followed by patterning the filling layer Zj. The next is Step S3p of forming a first upper metal layer 4mc (third metal film), followed by Step S3P of photolithography. Then in Step S3q, the first upper metal layer 4mc undergoes patterning to form first connection wires C1 (FIGS. 6 and 7).

The next is Step S3r of applying a first resin layer 20 (first flattening film), followed by Step S3R of photolithography. Then in Step S3s, the first resin layer 20 undergoes patterning to form contact holes CH1 and CH2 (FIG. 6) in a first resin film 31 (FIG. 7), which is made of the same material and disposed in the same layer as the first resin layer 20. To form hollows 32 (FIGS. 9, 10, and 11), a graytone mask is used.

Figure 6:
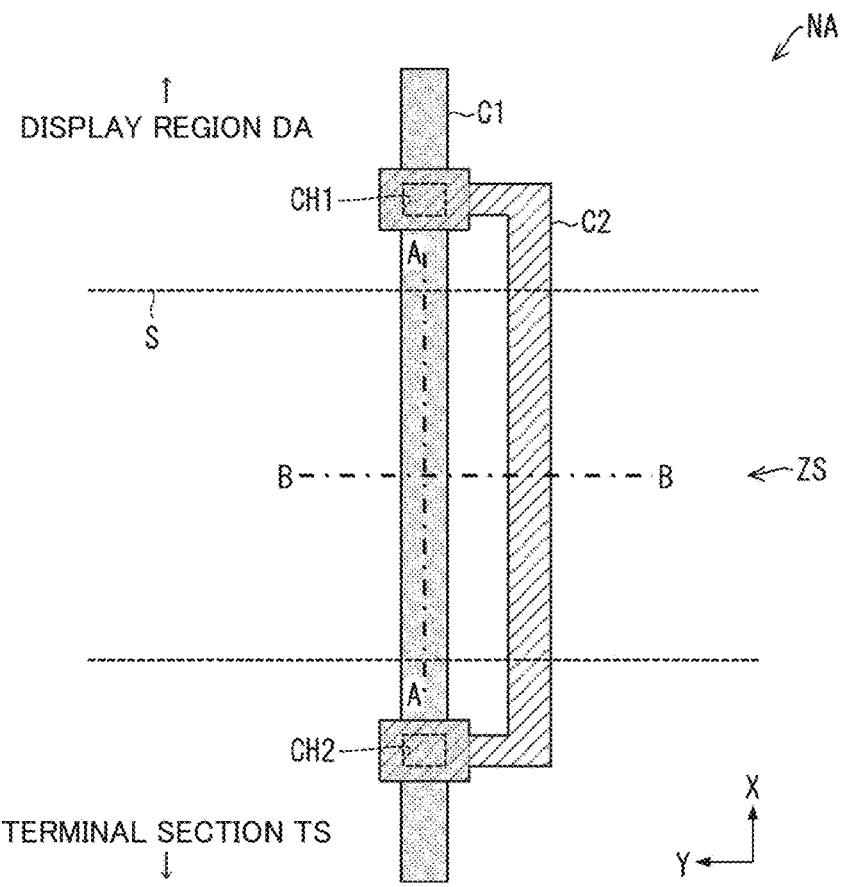
FIG. 6 is a plan view of a frame region in a first embodiment.

The next is Step S3w of forming a second upper metal layer 4md (fourth metal film), followed by Step S3W of photolithography, followed by Step S3x of patterning the second upper metal layer 4md to form second connection wires C2 (FIG. 6). The next is Step S3y of applying a second resin layer 21 (second flattening film), followed by Step S3Y of photolithography. Then in Step S3z, the second resin layer 21 undergoes patterning to form contact holes for anodes 22.

The next is Step S4a of film formation for the anodes 22 (first electrodes), followed by Step S4A of photolithography, followed by Step S4b of patterning for the anodes 22. The next is Step S4c of applying a third resin layer 23 (edge cover), followed by Step S4C of photolithography, followed by Step S4d of patterning the third resin layer 23, followed by Step S4e of evaporating an EL layer 24, followed by Step S4f of forming a cathode 25. Then in Step S5, the sealing layer 6 is formed.

The flexible substrate 12 is made of, but not limited to, polyimide. The flexible substrate 12 can be substituted by two polyimide films and an inorganic insulating film interposed between these films.

The barrier layer 3 prevents foreign substances, such as water, oxygen, and movable ions, from entering the TFT layer 4 and light emitter layer 5. The barrier layer 3 can be composed of a silicon oxide film, a silicon nitride film, or a silicon oxide nitride film, all of which are formed through CVD, or can be composed of a stack of these layers.

The semiconductor layer 15 can be made of low-temperature polysilicon (LTPS) or oxide semiconductor (e.g., In—Ga—Zn—O semiconductor).

The first lower metal layer 4ma, the second lower metal layer 4mb, the first upper metal layer 4mc, and the second upper metal layer 4md are composed of, for instance, a metal monolayer film or metal multilayer film containing at least one of aluminum, tungsten, molybdenum, tantalum, chromium, titanium and copper. The first upper metal layer 4mc and second upper metal layer 4md in particular can be composed of a low-resistance metal layer composed of an aluminum film sandwiched by two titanium films. The second upper metal layer 4md can be composed of a 2-ply layer consisting of an aluminum film and a titanium film stacked thereon.

The first lower metal layer 4ma and the second lower metal layer 4mb are preferably made of the same metal, and the first upper metal layer 4mc and the second upper metal layer 4md are preferably made of the same metal.

The inorganic insulating films 16, 18 and 19 and a protective layer can be composed of a silicon oxide (SiOx) film or a silicon nitride (SiNx) film, both of which are formed through CVD, or can be composed of a laminate of these films.

The filling layer Zj, the first resin layer 20, and the second resin layer 21 can be made of an organic material that can be applied, such as polyimide or acrylic.

A transistor Tr includes the semiconductor layer 15, a gate electrode GE, included in the first lower metal layer 4ma, and the conduction electrode DE (source and drain electrodes), included in the first upper metal layer 4mc.

Figure 5:
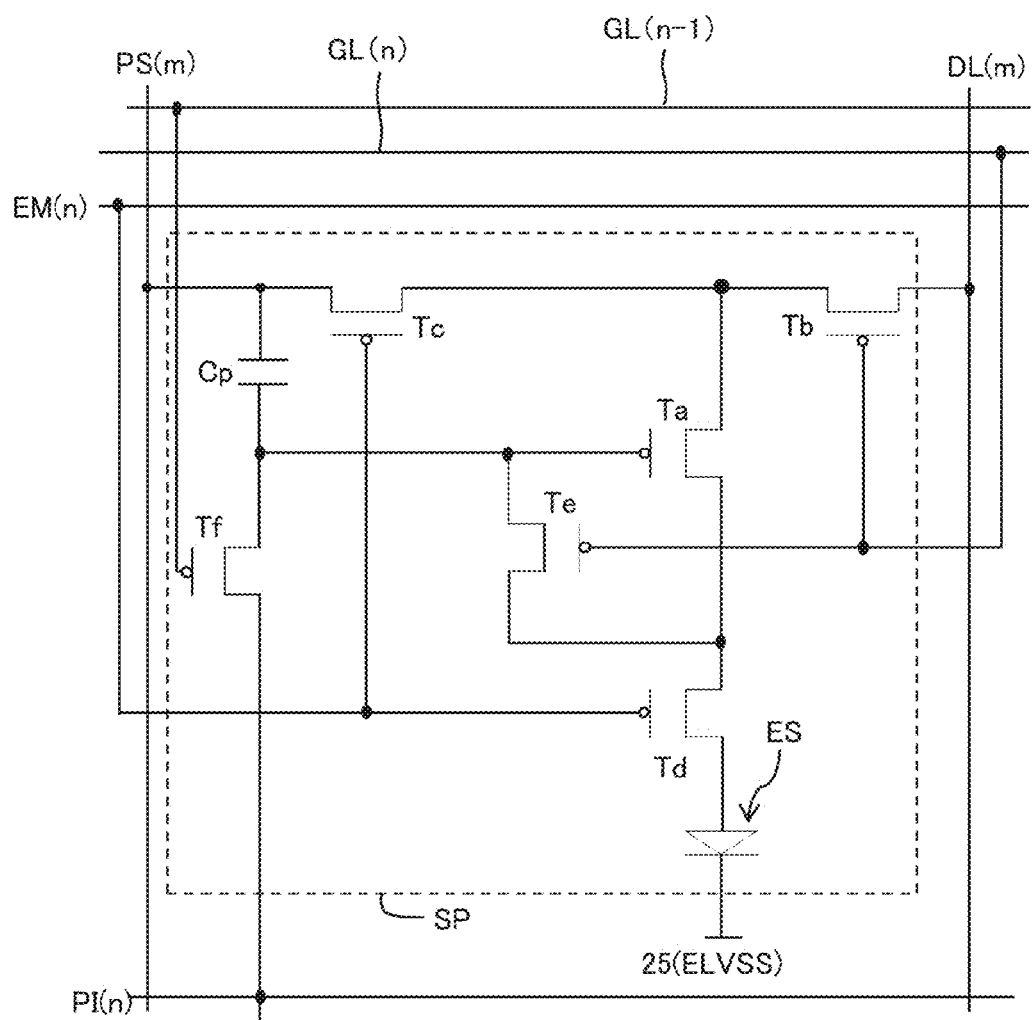
FIG. 5 is a circuit diagram illustrating a sub-pixel.

The display region DA includes a pixel circuit of a sub-pixel SP (corresponding to the mth column and nth row), shown in FIG. 5, disposed so as to correspond to the intersection between a data signal line DL (m) in the mth column and a scan signal line GL (n) in the nth row. The foregoing has described an example configuration of the pixel circuit, and thus other publicly known configurations can be used. The pixel circuit in FIG. 5 includes the following: one light emitter ES; six transistors (a drive transistor Ta, a write control transistor Tb, a power-supply control transistor Tc, an emission control transistor Td, a threshold-voltage compensation transistor Te, and an initialization transistor Tf); and one capacitor Cp. The transistors Ta to Tf are p-channel transistors. The capacitor Cp is a capacitive element having two electrodes. The power-supply control transistor Tc and the emission control transistor Td have their control terminals connected to an emission control line EM (n). The scan signal line GL (n) is connected the control terminals of the write control transistor Tb and threshold-voltage compensation transistor Te. The scan signal line GL (n−1) is connected to the control terminal of the initialization transistor Tf. The initialization transistor Tf has one conduction terminal connected to an initialization power-source line PI (n). The data signal line DL (m) is connected to one of the conduction terminals of the write control transistor Tb. The power-supply control transistor Tc has one conduction terminal connected to a high-voltage power source line PS (m), which supplies high power-source voltage ELVDD. The cathode 25 of the light emitter ES is a common electrode shared among a plurality of pixel circuits and is electrically connected to low power-source voltage ELVSS.

The pixel circuit in FIG. 5 is a non-limiting example. The pixel circuit can be formed using n-channel transistors.

The display region DA is configured, for instance, such that the first lower metal layer 4ma includes the scan signal line GL (n), the emission control line EM (n), the gate electrodes of the respective transistors (Ta to Tf), and the gate wire GH (c.f., FIG. 3). The display region DA is also configured such that the second lower metal layer 4mb includes the initialization power-source line PI (n) and one of the electrodes CE (c.f., FIG. 3) of the capacitor Cp. The display region DA is also configured such that the first upper metal layer 4mc includes the data signal line DL (m), the conduction electrodes DE (source and drain electrodes) of the respective transistors, and source wires SH (c.f., FIG. 3), and such that the second upper metal layer 4md includes the high-voltage power source line PS (m). This configuration is merely illustrative and thus does not limit which wire is included in which metal layer.

The light emitter layer 5 includes the following: the anode 22; the third resin layer (edge cover) 23 covering the edge of the anode 22; the EL or electroluminescence layer 24 (luminous layer); and the cathode 25 (second electrode) in a higher position than the EL layer 24. The third resin layer 23 can be made of an organic material that can be applied, such as polyimide or acrylic.

The display region DA includes a display element provided for each sub-pixel SP. The display element includes the light emitter ES (e.g., an OLED or organic light-emitting diode, and a QLED or quantum-dot light-emitting diode) having the anode 22, EL layer 24 and cathode 25, all provided in the form of an island, and included in the light emitter layer 5 (light emitter). The display element also includes a control circuit (included in the TFT layer 4) of the light emitter ES.

The EL layer 24 is composed of the following layers sequentially stacked from below for instance: a hole injection layer, a hole transport layer, a luminous layer, an electron transport layer, and an electron injection layer. The luminous layer is provided in the form of islands overlapping the openings of the third resin layer (edge cover) 23 through a vapor deposition method or an ink-jet method. The other layers are provided in the form of islands or in a flat manner (common layer). One or more of the hole injection layer, hole transport layer, electron transport layer and electron injection layer can be omitted.

Forming a luminous layer of an OLED uses a fine metal mask (FMM). An FMM is a sheet (made of Invar for instance) having many through-holes, through one of which an organic substance passes, thus forming an island-shaped luminous layer (corresponding to a single sub-pixel).

Forming a luminous layer of a QLED uses ink-jet application of a solvent containing diffused quantum dots for instance, thus forming an island-shaped luminous layer (corresponding to a single sub-pixel).

For instance, the anode 22 is composed of a stacked layer of indium tin oxide (ITO) and silver (Ag) or is composed of a stacked layer of ITO and Ag-containing alloy. The anode 22 reflects light. The cathode 25 can be composed of a conductor transparent to light, such as a MgAg alloy (extremely thin film), an ITO, or an indium zinc oxide (MO).

When the light emitter ES is an OLED, a drive current between the anode 22 and cathode 25 rejoins holes and electrons within the luminous layer, thus generating excitons. These excitons emit light in the process of transition to a ground state. Since the cathode 25 transmits light, and the anode 22 reflects light, light from the EL layer 24 travels upward and goes out from the top.

When the light emitter ES is a QLED, a drive current between the anode 22 and cathode 25 rejoins holes and electrons within the luminous layer, thus generating excitons. These excitons emit light (fluorescent light) in the process of transition from a conduction band level of the quantum dots to a valence band level of the quantum dots.

The light emitter layer 5 may include light emitters (e.g., inorganic light-emitting diodes) other than such OLEDs and QLEDs as described above.

The sealing layer 6 transmits light. The sealing layer 6 includes an inorganic sealing film 26 covering the cathode 25, an organic buffer film 27 in a higher position than the inorganic sealing film 26, and an inorganic sealing film 28 in a higher position than the organic buffer film 27. The sealing layer 6, which covers the light emitter layer 5, prevents foreign substances, such as water, oxygen and movable ions, from penetrating the light emitter layer 5.

Each of the inorganic sealing films 26 and 28 is an inorganic insulating film. Each of the inorganic sealing films 26 and 28 can be composed of a silicon oxide film, a silicon nitride film, or a silicon oxide nitride film, all of which are formed through CVD for instance, or can be composed of a stack of these films. The organic buffer layer 27 is an organic film that is transparent to light and flattens a film. The organic buffer layer 27 can be made of an organic material that can be applied, such as acrylic. The organic buffer film 27 can be formed through ink-jet application for instance.

The lower film 10 is, but not limited to, a PET film that is attached to the lower surface of the flexible substrate 12 after the removal of the support substrate, thus achieving a highly flexible display device. The function film 39 serves as, but not limited to, at least one of an optical compensator, a touch sensor and a protector.

Figure 8:
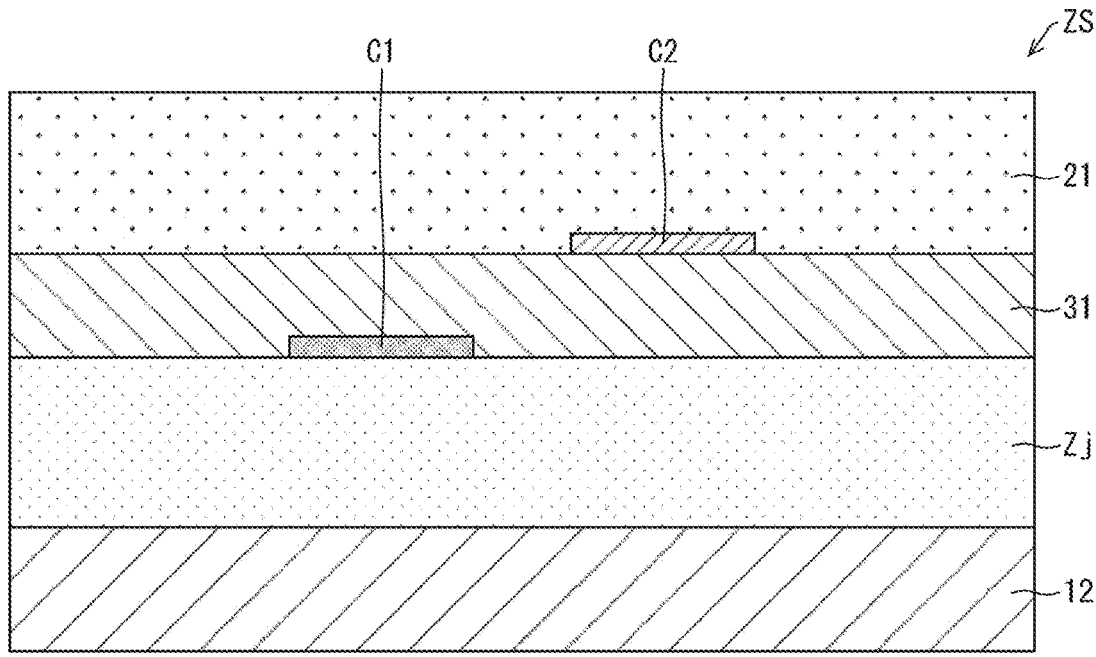
FIG. 8 is a sectional view taken along plane BB in FIG. 6.

FIG. 6 is a plan view of the frame region NA in the first embodiment. FIG. 7 is a sectional view taken along plane AA in FIG. 6. FIG. 8 is a sectional view taken along plane BB in FIG. 6. Components similar to those previously described will be denoted by similar reference signs, and the detailed description of the similar components will not be repeated.

The slit S in the bending section ZS extends through the barrier layer 3, inorganic insulating film 16 (gate insulating film), inorganic insulating film 18 (first interlayer insulating film) and inorganic insulating film 19 (second interlayer insulating film) along the plane BB, where the bending section ZS extends. The slit S is filled with the filling layer Zj. The display device is bent about 180 degrees along the bending section ZS.

The display region DA includes a plurality of first display wires, including the data signal line DL (m) and source wires SH. The first display wires are composed of the first upper metal layer 4mc (third metal film). The display region DA also includes the first resin layer 20 (first flattening film) covering the individual first display wires. On the first resin layer 20 are a plurality of second display wires, including the high-voltage power source line PS (m). The second display wires are composed of the second upper metal layer 4md (fourth metal film). The individual second display wires are covered with the second resin layer 21 (second flattening film).

The bending section ZS includes the plurality of first connection wires C1 arranged on the upper surface of the filling layer Zj along the plane AA intersecting with the plane BB, where the bending section ZS extends. The first connection wires C1 electrically connect the terminals TMb and TMc at the terminal section TS to the first display wires and are composed of the first upper metal layer 4mc. The first connection wires C1 are covered with the first resin film 31, which is made of the same material and disposed in the same layer as the first resin layer 20.

The bending section ZS also includes the plurality of second connection wires C2 arranged on the upper surface of the first resin film 31 along the plane AA intersecting with the plane BB, where the bending section ZS extends. The second connection wires C2 are composed of the second upper metal layer 4md. Each second connection wire C2 is electrically connected to the corresponding first connection wire C1 via the contact hole CH1 (display-side contact portion) adjacent to the display region DA in the bending section ZS and via the contact hole CH2 (terminal-side contact portion) adjacent to the terminal section TS in the bending section ZS.

The first connection wire C1 and the second connection wire C2 do not overlap each other in a plan view at least partly between the contact holes CH1 and CH2.

The contact holes CH1 and CH2 are preferably contact holes bored in the first resin film 31.

The first connection wire C1 and the second connection wire C2 do not overlap each other in a plan view between the contact holes CH1 and CH2 with the first resin film 31 interposed therebetween.

As such, the first connection wire C1 and the second connection wire C2 do not overlap each other at least partly between the contact holes CH1 and CH2. The first connection wire C1 and the second connection wire C2 thus no longer constitute a stacked structure at a location where they do not overlap each other. This facilitates bending the bending section ZS and can avoid a crack between the first connection wire C1 and second connection wire C2, thereby preventing the first connection wire C1 and second connection wire C2 from breakage and increased resistance both resulting from such a crack.

In some embodiments, an inorganic insulating film 37 (third interlayer insulating film) may be further provided between the first resin layer 20 and second upper metal layer 4md (c.f., FIGS. 3 and 7). The inorganic insulating film 37 may be provided between the second upper metal layer 4md and second resin layer 21.

The first resin film 31 in the bending section ZS may be thinner than the first resin film 31 in the display region DA. The first connection wire C1 and the second connection wire C2 may or may not be made of the same material. The first connection wire C1 and the second connection wire C2 may or may not have the same width.

First Modification

Figure 9:
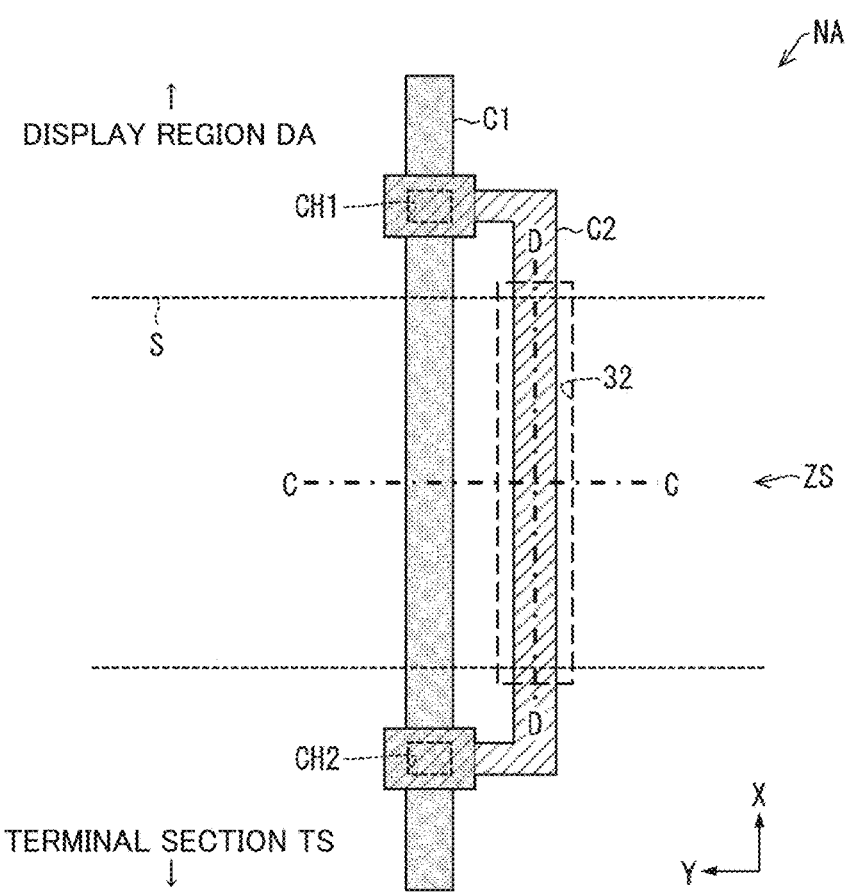
FIG. 9 is a plan view of the frame region in a first modification.
Figure 10:
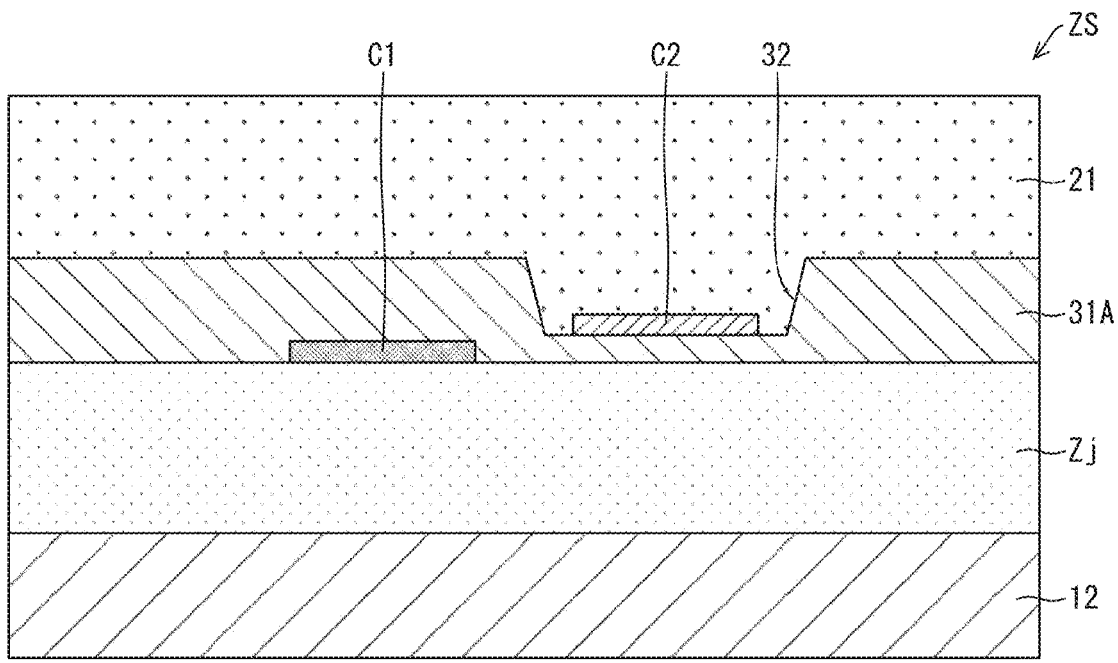
FIG. 10 is a sectional view taken along plane CC in FIG. 9.
Figure 11:
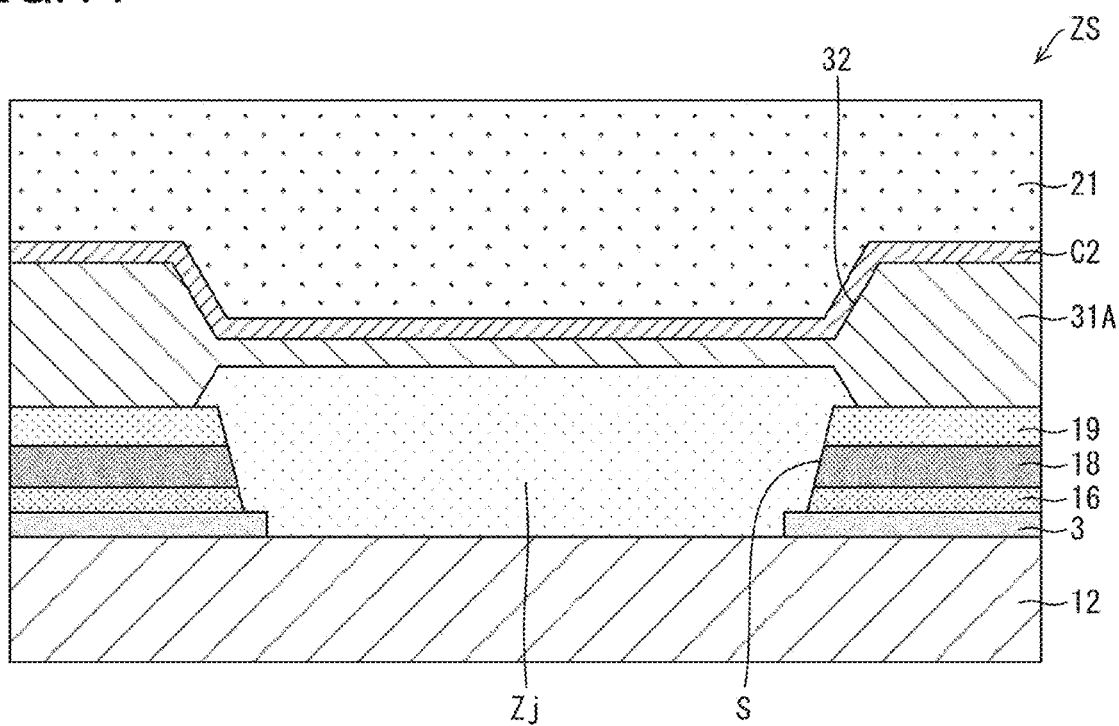
FIG. 11 is a sectional view taken along plane DD in FIG. 9.

FIG. 9 is a plan view of the frame region NA in a first modification. FIG. 10 is a sectional view taken along plane CC in FIG. 9. FIG. 11 is a sectional view taken along plane DD in FIG. 9. Components similar to those previously described will be denoted by similar reference signs, and the detailed description of the similar components will not be repeated.

A first resin film 31A has a hollow 32 overlapping the second connection wire C2 between the contact holes CH1 and CH2. The first connection wire C1 and the second connection wire C2 overlap each other between the contact holes CH1 and CH2 in a thickness direction perpendicular to the flexible substrate 12, with the hollow 32 interposed therebetween. In this way, the second connection wire C2 is disposed within the hollow 32, which extends along the plane DD, along the plane DD, where the hollow 32 extends. This brings the first connection wire C1 and second connection wire C2 close to each other in the thickness direction perpendicular to the flexible substrate 12, thereby further facilitating bending the bending section ZS.

The first resin film 31A remains thin under the second connection wire C2. This effectively avoids the first connection wire C1 from being etched.

The bending center line of the bending section ZS in the thickness direction perpendicular to the flexible substrate 12 is positioned between the first connection wire C1 and second connection wire C2, thus achieving a reduction in stress that is exerted on the first connection wire C1 and second connection wire C2 at the time of bending.

Second Modification

Figure 12:
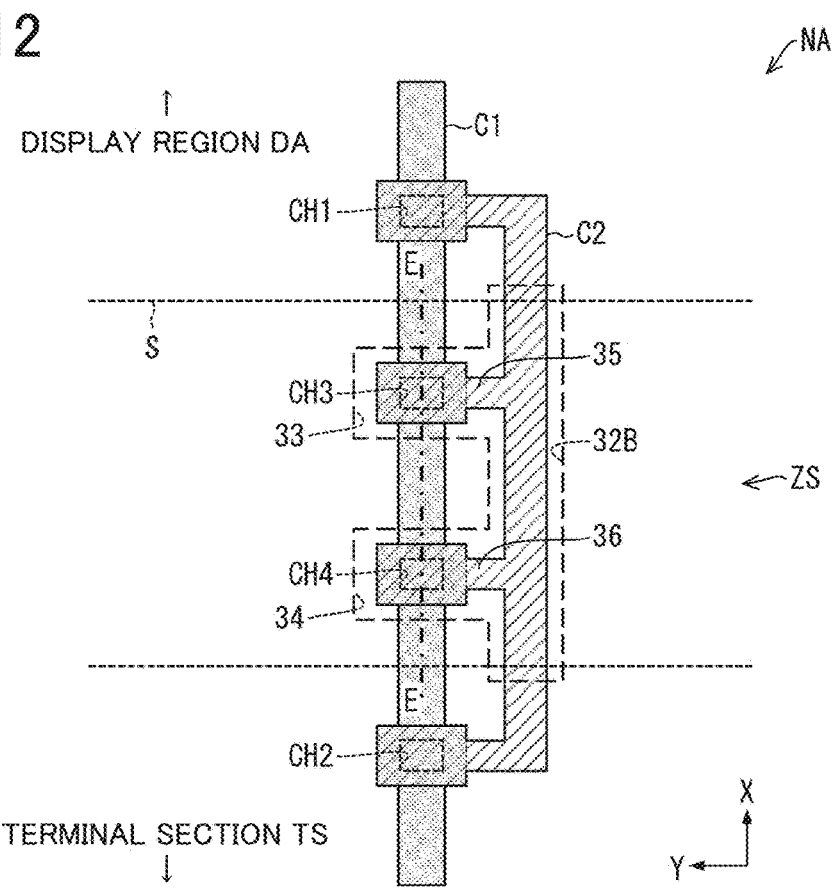
FIG. 12 is a plan view of the frame region in a second modification.
Figure 13:
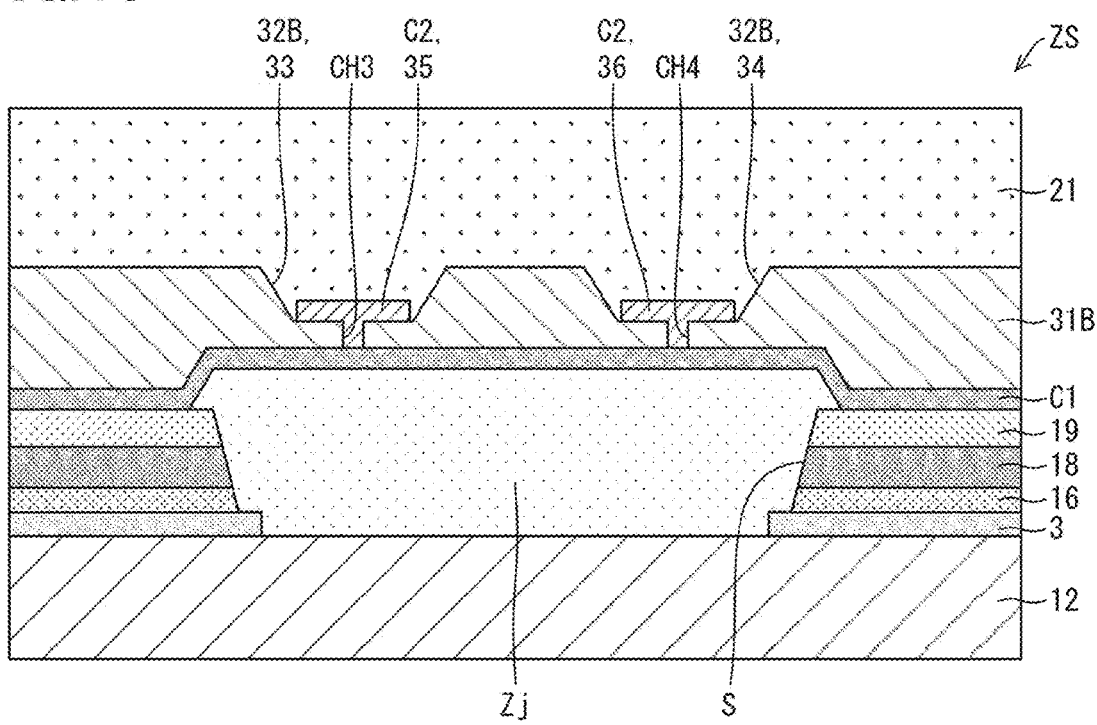
FIG. 13 is a sectional view taken along plane EE in FIG. 12.

FIG. 12 is a plan view of the frame region NA in a second modification. FIG. 13 is a sectional view taken along plane EE in FIG. 12. Components similar to those previously described will be denoted by similar reference signs, and the detailed description of the similar components will not be repeated.

The second modification is different from the first modification in that the first connection wire C1 and the second connection wire C2 are electrically connected together via contact holes CH3 and CH4. The contact holes CH3 and CH 4 are arranged between the contact holes CH1 and CH2 and are bored in a hollow 32B bored in a first resin film 31B.

The hollow 32B has extended hollows 33 and 34 extending from near the second connection wire C2 toward the first connection wire C1. The second connection wire C2 has extended parts 35 and 36. The extended part 35 extends over the first connection wire C1 along the extended hollow 33, and the extended part 36 extends over the first connection wire C1 along the extended hollow 34. The extended hollow 33 on the first connection wire C1 is provided with the contact hole CH3. The extended hollow 34 on the first connection wire C1 is provided with the contact hole CH4. The first connection wire C1 and the second connection wire C2 are electrically connected together via the contact holes CH3 and CH4.

Second Embodiment

FIG. 4 is a plan view of the frame region NA in a second embodiment. FIG. 15 is a sectional view taken along plane FF in FIG. 14. Components similar to those previously described will be denoted by similar reference signs, and the detailed description of the similar components will not be repeated.

The first connection wire C1 and the second connection wire C2 are arranged across a line linking the contact holes CH1 and CH2 together and are symmetrical in a plan view with respect to the line.

The first connection wire C1 and the second connection wire C2 are electrically connected together at their intersections in a plan view via the contact holes CH3 and CH4 bored in a first resin film 31C.

The first connection wire C1 extends in a negative X-direction on the upper surface of the filling layer Zj to reach the contact hole CH1 and then extends further in the negative X-direction. The first connection wire C1 then extends in a Y-direction on the upper surface of the filling layer Zj, then extends in the negative X-direction and then extends in a negative Y-direction to reach the contact hole CH3. The first connection wire C1 then extends in the negative Y-direction on the upper surface of the filling layer Zj from the contact hole CH3, then extends in the negative X-direction and then extends in the Y-direction to reach the contact hole CH4. The first connection wire C1 then extends in the Y-direction on the upper surface of the filling layer Zj from the contact hole CH4, then extends in the negative X-direction, then extends in the negative Y-direction and then extends in the negative X-direction to reach the contact hole CH2.

The first connection wire C2 in contrast extends in the negative Y-direction on the upper surface of the first resin film 31C from the contact hole CH1, then extends in the negative X-direction and then extends in the Y-direction to reach the contact hole CH3. The second connection wire C2 next extends in the Y-direction on the upper surface of the first resin film 31C from the contact hole CH3, then extends in the negative X-direction and then extends in the negative Y-direction to reach the contact hole CH4. The second connection wire C2 then extends in the negative Y-direction on the upper surface of the first resin film 31C from the contact hole CH4, then extends in the negative X-direction, then extends in the Y-direction and then extends in the negative X-direction to reach the contact hole CH2.

As described above, the first connection wire C1 and the second connection wire C2 extend zigzag so as to be symmetrical in a plan view with respect to the line linking the contact holes CH1 and CH2 together, and the first connection wire C1 and the second connection wire C2 are electrically connected together via the contact holes CH3 and CH4, which are bored at the intersections between these wires C1 and C2.

Figure 16:
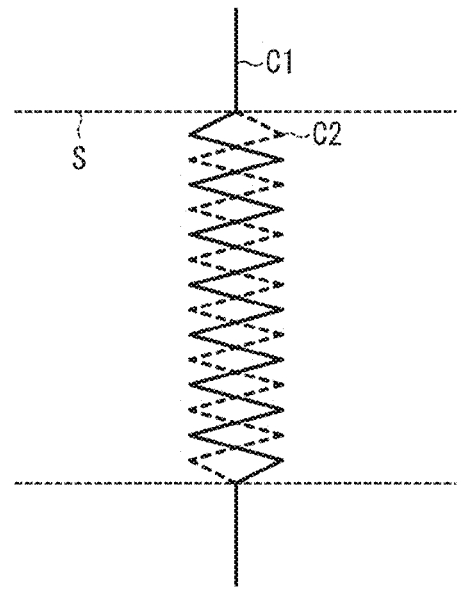
FIG. 16 is a plan view of the frame region in a first modification.
Figure 17:
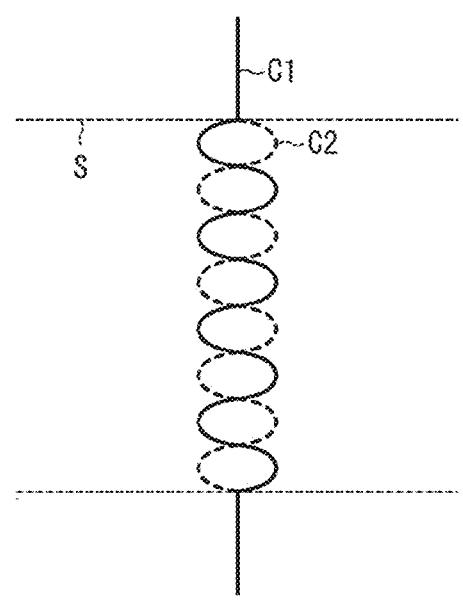
FIG. 17 is a plan view of the frame region in a second modification.

FIG. 16 is a plan view of the frame region NA in a first modification. FIG. 17 is a plan view of the frame region NA in a second modification. Components similar to those previously described will be denoted by similar reference signs, and the detailed description of the similar components will not be repeated.

Figure 14:
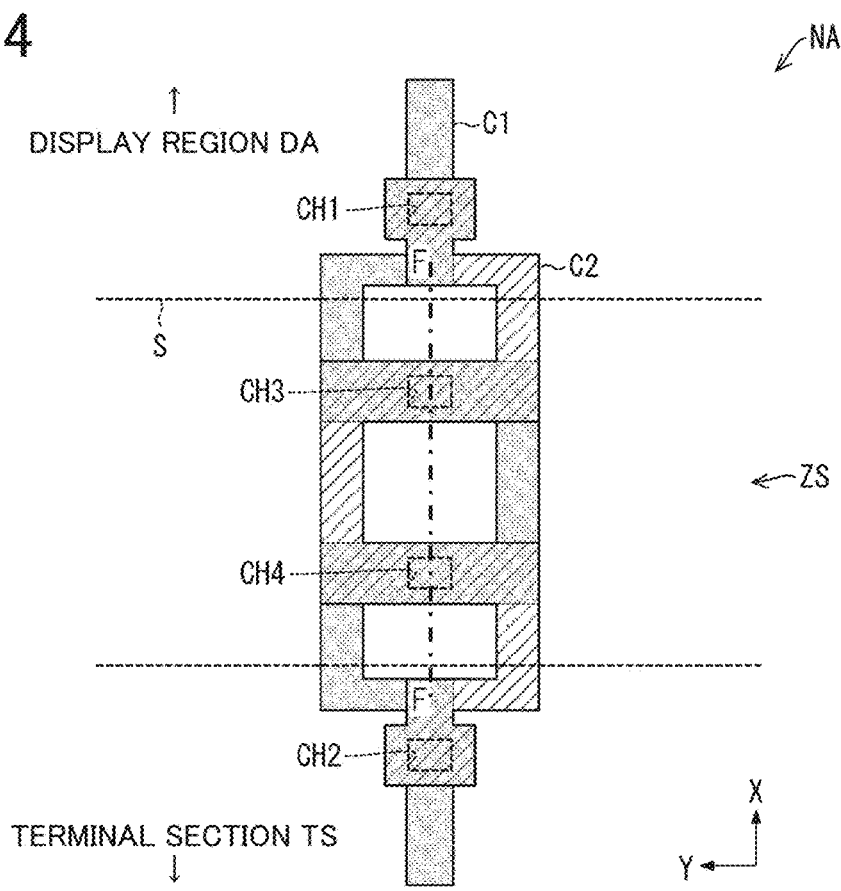
FIG. 14 is a plan view of the frame region in a second embodiment.
Figure 15:
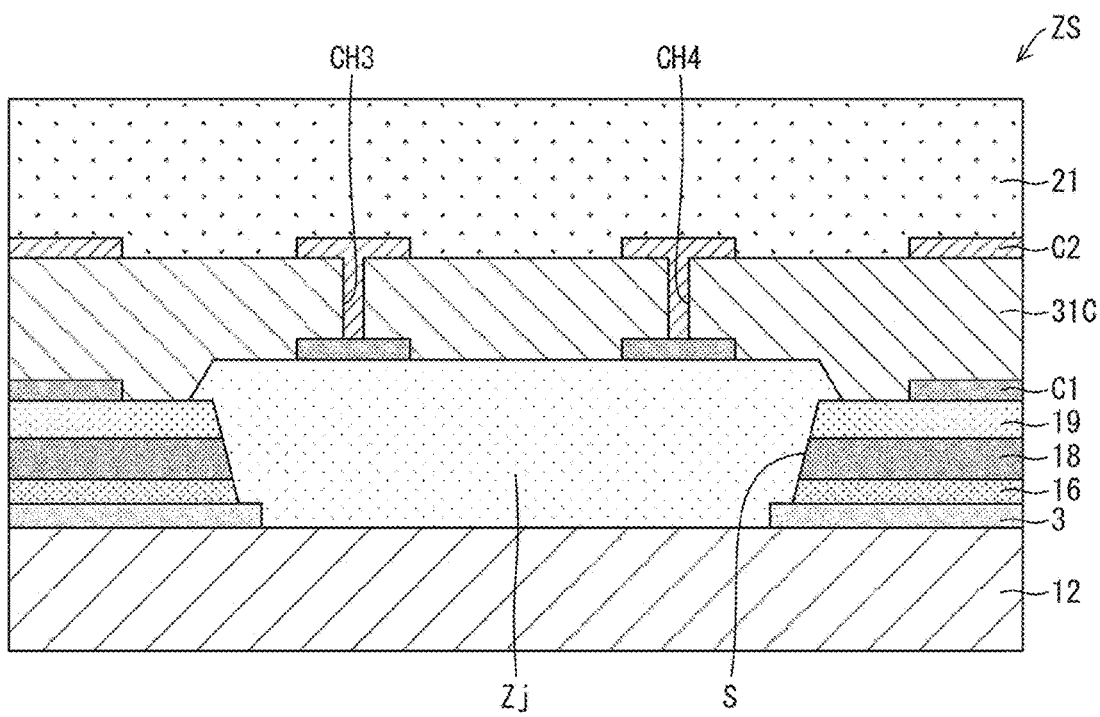
FIG. 15 is a sectional view taken along plane FF in FIG. 14.

The foregoing has described, with reference to FIG. 14, a non-limiting example where the first connection wire C1 and the second connection wire C2 extend in the form of a right-angle lattice. The first connection wire C1 and the second connection wire C2 need to be arranged across a line linking the contact holes CH1 and CH2 together, and need to be symmetrical in a plan view with respect to the line. For instance, the first connection wire C1 and the second connection wire C2 may extend in the form of a diamond-shaped lattice, as illustrated in FIG. 16, or may extend in the form of a circular lattice, as illustrated in FIG. 17.

The contact holes CH3 and CH4 may be omitted, as illustrated in FIGS. 16 and 17. However, the contact holes CH3 and CH4 are preferably provided, because they provide the first connection wire C1 and second connection wire C2 with redundancy and reduces a stress that is exerted on the first connection wire C1 and second connection wire C2.

Figure 18:
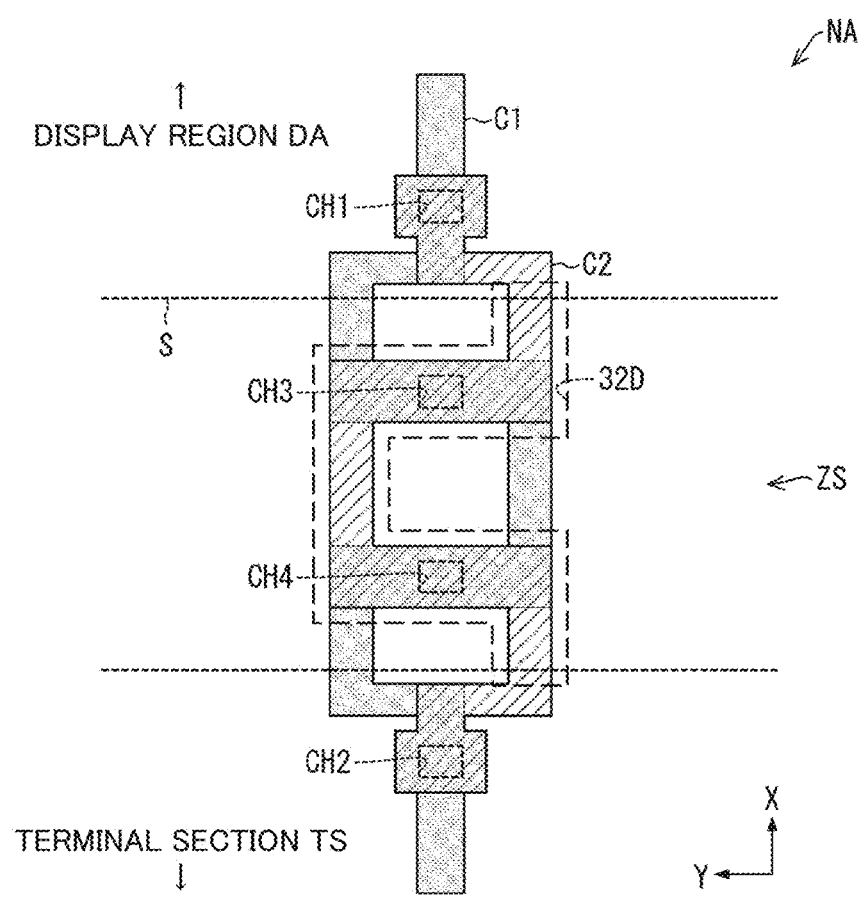
FIG. 18 is a plan view of the frame region in a third modification.

FIG. 18 is a plan view of the frame region NA in a third modification. Components similar to those previously described will be denoted by similar reference signs, and the detailed description of the similar components will not be repeated.

This frame region NA is different from that described in FIGS. 14 and 15 in the following two points. One of the differences is that the frame region NA has a hollow 32D overlapping the second connection wire C2 in a plan view between the contact holes CH1 and CH2. The other difference is that the first connection wire C1 and the second connection wire C2 intersect with each other with the hollow 32D interposed therebetween.

The first connection wire C1 and the second connection wire C2 are electrically connected together at their intersections via the contact holes CH3 and CH4 bored in the hollow 32D.

The disclosure is not limited to the foregoing embodiments and can be modified in various manners within the scope of the claims. The technical scope of the disclosure includes an embodiment that is obtained in combination as necessary with technical means disclosed in various embodiments. In addition, combining the technical means disclosed in the respective embodiments can form a new technical feature.

The invention claimed is:

1. A display device comprising:
a resin substrate;
a thin-film transistor layer disposed on the resin substrate;
a light emitter disposed on the thin-film transistor layer;
a display region; and
a frame region disposed around the display region,
wherein the frame region includes
a terminal section disposed at an end of the frame region, and
a bending section extending in one direction between the terminal section and the display region,
the thin-film transistor layer has a stack of, in sequence, a semiconductor layer, a gate insulating film, a first metal film, a first interlayer insulating film, a second metal film, a second interlayer insulating film, a third metal film, a first flattening film, a fourth metal film, and a second flattening film,
the light emitter includes
a plurality of first electrodes arranged on the second flattening film,
an edge cover covering perimeters of the plurality of first electrodes,
a luminous layer, and
a second electrode,
the bending section has a slit extending through the gate insulating film, the first interlayer insulating film and the second interlayer insulating film along the bending section,
the slit is filled with a filling layer,
the display region includes
a plurality of first display wires composed of the third metal film,
the first flattening film covering the plurality of individual first display wires,
a plurality of second display wires arranged on the first flattening film and composed of the fourth metal film, and
the second flattening film covering the plurality of individual second display wires,
the bending section includes
a plurality of first connection wires arranged on an upper surface of the filling layer in a direction intersecting with a direction where the bending section extends, the plurality of first connection wires electrically connecting terminals at the terminal section to the plurality of first display wires, the plurality of first connection wires being composed of the third metal film,
a first resin film covering the plurality of first connection wires, the first resin film being made of a material identical to a material of the first flattening film, the first resin film being disposed in a layer identical to a layer where the first flattening film is disposed, and
a plurality of second connection wires arranged on an upper surface of the first resin film in the direction intersecting with the direction where the bending section extends, the plurality of second connection wires being composed of the fourth metal film,
each of the plurality of second connection wires is electrically connected to a corresponding one of the plurality of first connection wires via a display-side contact portion adjacent to the display region in the bending section and via a terminal-side contact portion adjacent to the terminal section in the bending section, and
the first and second connection wires do not overlap each other at least partly between the display-side and terminal-side contact portions.

2. The display device according to claim 1, wherein
the first resin film has a hollow overlapping the second connection wire between the display-side and terminal-side contact portions.

3. The display device according to claim 2, wherein
the first and second connection wires overlap each other between the display-side and terminal-side contact portions with the hollow interposed between the first and second connection wires.

4. The display device according to claim 2, wherein
the first and second connection wires are electrically connected together between the display-side and terminal-side contact portions via a contact hole disposed in the hollow.

5. The display device according to claim 1, wherein
the first and second connection wires are arranged across a line linking the display-side and terminal-side contact portions together, and
the first and second connection wires are symmetrical in a plan view with respect to the line.

6. The display device according to claim 5, wherein
the first and second connection wires are electrically connected together at an intersection between the first and second connection wires via a contact hole disposed in the first resin film.

7. The display device according to claim 5, wherein
the first resin film has a hollow overlapping the second connection wire between the display-side and terminal-side contact portions, and
the first and second connection wires intersect with each other with the hollow interposed between the first and second connection wires.

8. The display device according to claim 7, wherein
the first and second connection wires are electrically connected together at an intersection between the first and second connection wires via a contact hole disposed in the hollow.

9. The display device according to claim 1, wherein
the display-side and terminal-side contact portions are contact holes disposed in the first resin film.

10. The display device according to claim 1, further comprising
a third interlayer insulating film disposed between the first flattening film and the fourth metal film.

11. The display device according to claim 1, wherein
the first and second connection wires do not overlap each other between the display-side and terminal-side contact portions with the first resin film interposed between the first and second connection wires.

* * * * *